United States Patent [19]

Loubier et al.

[11] Patent Number: 4,691,185

[45] Date of Patent: Sep. 1, 1987

[54] SOLID STATE MAGNETIC MICROSWITCH

[75] Inventors: Robert J. Loubier; William F. Bleeke, both of Fort Wayne, Ind.

[73] Assignee: Xolox Corporation, Fort Wayne, Ind.

[21] Appl. No.: 681,562

[22] Filed: Dec. 14, 1984

[51] Int. Cl.⁴ .................... H05B 43/00; H01H 9/00
[52] U.S. Cl. ............................... 338/32 H; 335/207
[58] Field of Search ............ 338/32 H; 335/205, 202, 335/207

[56] References Cited

U.S. PATENT DOCUMENTS 3,680,026 7/1972 Masuda et al. ................. 338/32 H

Primary Examiner—E. A. Goldberg
Assistant Examiner—M. M. Lateef
Attorney, Agent, or Firm—Pearne, Gordon, McCoy & Granger

[57] ABSTRACT

Fluid flow indicator is provided in which a fluid pressure to position transducer moves a permanent magnet from a no-flow position to a flow position in response to fluid pressure. The change in the position in the permanent magnet changes the intensity and polarity of the magnetic field that the permanent magnet places upon a Hall effect semiconductor; so that a switching function results as a function of fluid pressure differential causing no-flow and flow conditions. The change in magnitude and polarity of the magnetic field between first and second distances from one surface of the permanent magnet is increased by providing an opening through the permanent magnet and by providing a magnetic device near the opposite surface of the magnet.

5 Claims, 7 Drawing Figures

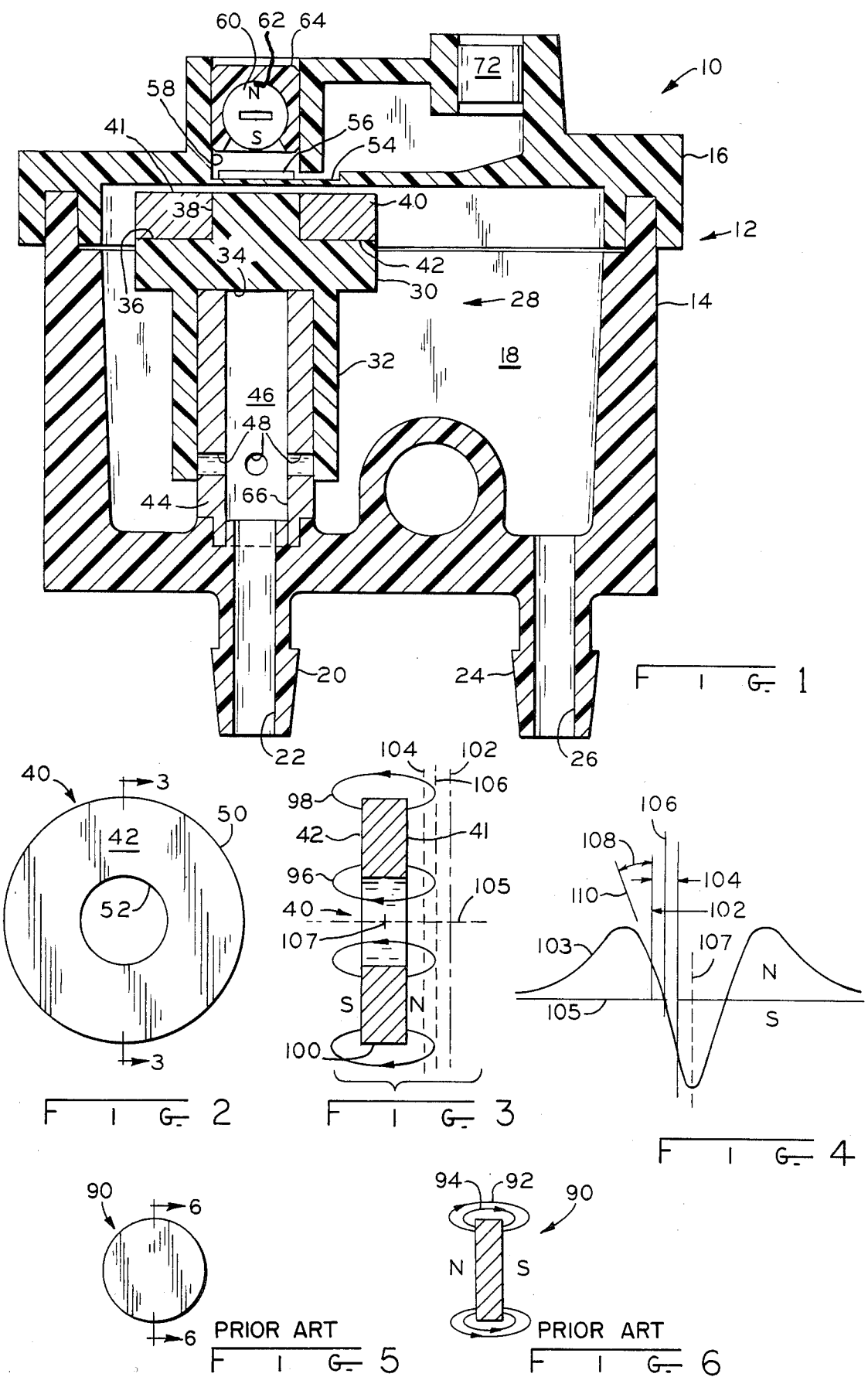

4,691,185

SOLID STATE MAGNETIC MICROSWITCH

TECHNICAL FIELD

The present invention relates generally to magnetic switches and more particularly to solid state magnetic microswitches employing conventional magnetically actuated sensors or semiconductors such as Hall effect devices, magneto-resistors and magneto transistors. The present invention is still more particularly directed to the use of such sensors, in such a manner as to provide an electrical signal in response to an extremely small mechanical movement, such as the type of movement conventionally detected by means of mechanical microswitches.

BACKGROND ART

In industrial processes, there is a need to provide reliable switching action in response to miniscule mechanical movements. Mechanical microswitches are conventionally provided for the purpose; however, it is well known that such switches include a number of moving parts, particularly contacts which can become defective due to fatigue, wear, particularly pitting or contamination to an extent as will render the switch inoperative.

As an example, often there is a need to indicate the presence of fluid flow. A typical type of flow indicator consists of a poppet that is raised in a tube in response to fluid flow, and the presence or absence of fluid flow is visually indicated by the vertical position of the poppet. In addition there are similar indicators which use permanent magnets and reed switches in response to poppet movement. There are industrial processes in which the rates of fluid flow are too small to function with these conventional types. It is imperative to, however, the successful function of the process that fluid continue without interruption.

So there is an industrial need for a fluid flow indicator that will function with miniscule flows, but a no-flow indication could go undetected by operating personnel for a length of time that could cause serious financial loss.

Another usage for a microswitch to which the present invention lends itself are the keys on a typewriter or computer keyboard, which are incorporated into microswitch assemblies switched "on" and "off" in response to vertical key actuation. In such devices, it is essential that the switching action obtained be definitive and an abrupt transition between "on" and "off" conditions.

DISCLOSURE OF THE INVENTION

The present invention utilizes a magnetically actuated sensor in combination with an actuating magnet which is relatively movable. The actuating magnet is a permanent magnet modified to produce a magnetic field in one direction at a first distance from a first surface of the magnet and to provide a field in a different direction at a second distance from the same surface. By disposing the sensor between these two distances, it will be subjected to an abrupt change in field characteristics as it is moved relatively between such two distances. The form of the permanent magnet is one which is annular and is mounted on a movable member with the sensor being disposed a short distance from the magnet on the axis thereof. By moving the annular magnet, an abrupt field change can be applied to the sensor causing to to change states. This results in the desired switching action with minimum movement of a permanent magnet.

In connection with utilizing this invention to detect fluid flow, one of the sensor and permanent magnet is mounted on a movable valve and the other on a stationary part of valve mechanism. By utilizing fluid differential pressure to cause valve movement, this valve movement in turn will relatively move the magnet, which movement is detected by the sensor to provide a switching action. The switching action is thus indicative of the presence or absence of fluid flow.

In a typewriter or computer keyboard, a suitable supporting substrate, such as a printed circuit board, can mount a multiplicity of sensors spaced according to the keyboard pattern each of these sensors having associated therewith a finger-operated key which carries an annular magnet disposed in proximity to the respective semiconductor. Such key is held in position by suitable means such that it may be moved against a resilient force toward the sensor thereby changing the condition of the magnetic field on the sensor. This movement can be used, therefore, to cause a change of state of the sensor between "on" and "off" conditions thereby to indicate a change in position of the key.

BRIEF DESCRIPTION OF THE DRAWINGS

FIG. 1 is a sectional view of a preferred embodiment of the present invention;

FIG. 2 is a top view of the sensing magnet of the present invention;

FIG. 3 is a sectional view of the sensing magnet of FIG. 2, taken substantially as shown by section line 3—3 of FIG. 2, and illustrating the magnetic field thereof;

FIG. 4 is a graph of the field strength of the sensing magnet of FIGS. 2 and 3, illustrating polarity and magnetic field strength as a function of longitudinal positions both within a hole in the magnet and from the planar surfaces of the sensing magnet;

FIG. 5 is a top view of a cylindrically shaped permanent magnet as commonly used in industry;

FIG. 6 is a sectional view of the magnet of FIG. 5, taken substantially as shown by section line 6—6 of FIG. 5, and illustrating the magnetic field thereof.

Referring now to FIG. 1, fluid flow indicator 10 includes a housing 12 having a body 14 and a cover 16.

Figure 7:
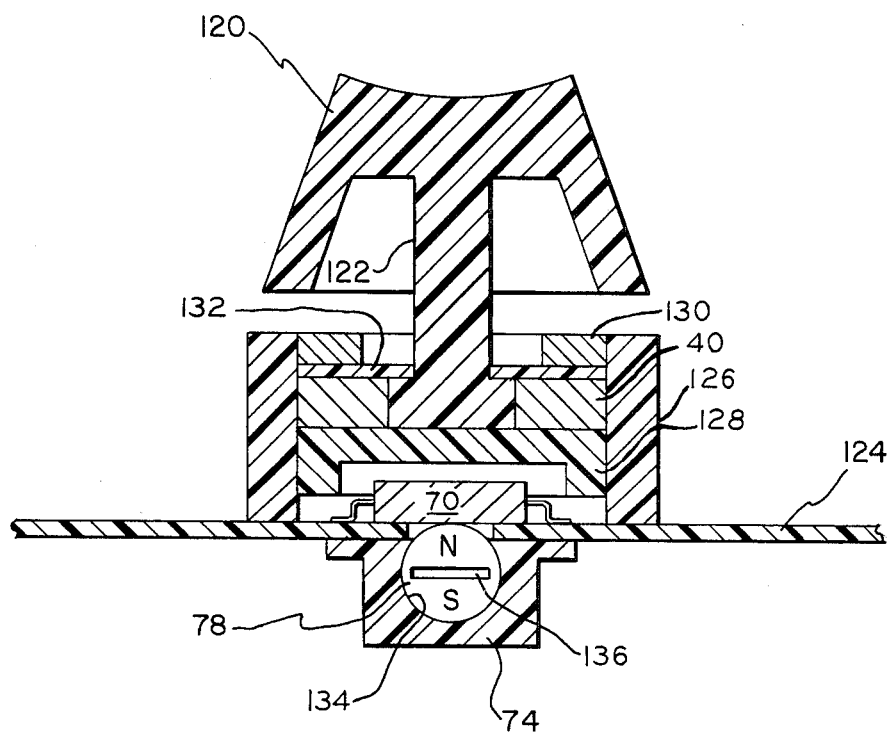
FIG. 7 is a fragmentary cross sectional view of another embodiment of this invention relating to a typewriter key.

The housing 12 includes a chamber 18, an inlet nipple 20 having an inlet port 22 that communicates with the chamber 18, and an outlet nipple 24 having an outlet port 26 that communicates with the chamber 18.

A fluid plunger device 28 is disposed within the chamber 18 and includes a generally tubular projection integrally formed of plastic having an annular head portion 30 and a sleeve portion 32, these portions 30 and 32 being coaxial. The head portion 30 is disc shaped with flat opposite sides 34 and 36, the side 36 having upstanding therefrom a cylindrical embossment 38. Fixedly mounted on the embossment 38 is an annular permanent magnet or actuating magnet 40 with north and south poles at the opposite ends or surfaces 41 and 42.

Secured to the housing 14 so as to upstand from the bottom thereof as shown in FIG. 1 is a tubular valve element 44 molded in place. The inside and outside diameter surfaces of the valve portions or elements 32 and 44 slidably engage so as to provide a seal against fluid flow therebetween. The upper end of the valve element 44 is flat so as to engage as a mechanical stop the flat undersurface 34 of the head portion 30. With the valve member 30, 32 in its illustrated position in engagement with the upper end of the valve element 44, flow of fluid is cut off between the chamber 46 which communicates with port 22 and the chamber 18. A series of circumferentially spaced openings or ports 48 are provided in the valve element 44 as shown which are normally covered when the movable valve member 30, 32 is in its illustrated downward position. Being so covered, the ports 48 are closed thereby severing any fluid communication between the chambers 46 and 18. Slight movement upwardly of the valve member 30, 32 uncovers portions of the ports 48 thereby establishing fluid flow from the port 22 into the chamber 46, from the chamber 46 into the chamber 18, and from chamber 18 out of port 26.

The valve element 44 is fabricated of a soft magnetic material, such as steel. The various parts described thus far as so dimensioned and the permanent magnet 40 is of such strength that the attractive force between the magnet 40 and the valve element 44 forcefully closes the head portion 30 of the valve member 30, 32 into sealing engagement with the upper end of the valve element 44. The valve portion 32 thus overlies and closes the ports 48. Further desired operating characteristic of these magnetic parts will be described later on.

Preferably, the housing body 14 and the housing cover 16 are molded plastic.

Further, the annular magnet 40 includes a cylindrical outside surface 50, and a concentric hole 52 between the parallel surfaces 41 and 42 on an axis normal thereto. The actuating magnet 40 is assembled over, and fixedly attached to the boss 38 on the head portion 32.

The housing cover 16 includes a thin wall or membrane section 54, that is an integrally molded portion of the cover 16 and that seals the chamber 18. A sensor, such as a Hall effect semiconductor, 56 is inserted into the cavity 58 and is attached by a chemical adhesive to the membrane 54.

A calibration magnet 60 of cylindrical form snugly fits into a socket 62 in molded body 64, the magnet 60 being adjustable rotationally within socket 62 and diametrically polarized typically as shown. By incrementally rotationally positioning magnet 60, the effect of the field therefrom as applied to sensor 56 can be adjusted thereby to set the "on" - "off" switching point of sensor 56 with reference to the available magnetic switching field. In other words, the sensor 56 can be calibrated to swtich "on" and "off" at equal values of oppositely directed flux from magnet 40, such as +25 and −25 gauss, respectively. The body 64 is press fitted into a companion socket or cavity as shown thereby to be stationary with respect to sensor 56. This calibrating structure is otherwise explained in detail in copending application entitled "Calibrating and Coordinating Hall Effect Devices", Robert J. Loubier, inventor, Ser. No. 652,867, filed Sept. 20, 1984.

In operation, the valve element 44 is magnetically attracted to the actuating magnet 40; so that the valving surfaces are resiliently urged into closed position, thereby blocking fluid communication from the inlet port 22 to the outlet port 26. Pressure fluid entering the inlet port 22 and chamber 46 acts against that portion of surface 34 which lies radially inward from the cylindrical bore 66. This surface portion 34 functions as the fluid pressure responsive area.

As fluid pressure acts against the surface 34, overcoming the magnetic force between the valve element 44 and the actuating magnet 40, the head portion 30, with the actuating magnet 40 attached thereto, is forced upwardly and away from the upper end of valve element 44, opening ports 48 thereby admitting fluid to chamber 18.

Further with reference to the operating of the valve device, when the valve is closed, there is a maximum differential pressure over the head portion 30 which includes valve surface 34, the difference in pressure being measured between the inlet and outlet ports 22 and 26. Pressure at the inlet port 22 is a maximum and at the outlet port 26 is a minimum. Holding the valve closed is the magnetic force between the magnet 40 and the magnetic valve element 44. Once the valve opens, the pressure difference between the two ports 22 and 26 reduces. If a helical compression spring were used in place of the magnet 40 to hold the valve closed, as the valve opened, the compression spring would be compressed further thereby increasing the force of closure. Since the pressure differential decreases the moment the valve cracks open, the valve would in all likelihood close. The result would be an oscillation of opening and closing due to the alternation of the pressure differential as well as the restoring force of the compression spring.

In the present invention, the attractive force between the magnet 40 and the valve element 44 is greatest when the valve is closed. At this point, the pressure differential tending to open the valve is the greatest. Once the valve opens, the magnetic closing force reduces as does the pressure differential. This reduction in magnetic closing force occurs by reason of the increased spacing between magnet 40 and the valve element 44. Since the magnetic attractive force has reduced to a level insufficient to close the valve against the reduced differential presure, pressure can occur through the ports 48 until such time as pressure to the inlet 22 is cut off entirely. No other spring means for maintaining the valve open and closed, in this manner, is presently known.

Recapitulating, this operation may be considered as having a characteristic of mechanical hysteresis whereby a snap action in valve operation may be obtained which differs from the action available from the use of a compression spring. With respect to the embodiment of this invention as shown in FIG. 1, there is less force required to hold the valve open than to open it initially, because less force is availbale after the valve opens. This force is in the form of the differential pressure, even though reduced, which holds the valve open against the restoring force, also reduced to the magnet.

Upward movement of the valve member 30, 32 is effective to move the sensing magnet 40, nearer to the sensor 56, and a change in magnetic field strength is thereby imposed upon the sensor 56.

A Hall effect sensor changes output voltage as a function of change in magnetic field strength to which it is subjected. Thus, moving the actuating magnet 40 closer to the sensor 56 effects a change voltage at the sensor output terminals.

This change in output voltage flow can be used to activate desired visual, audible, or automatic control functions.

However, there are problems that must be solved in order to acheive the operation as described above. One of these is to design a position sensor which will function reliably with extremely small fluid flow rates.

Contributing to the solution is the use of the annular or tubular valve arrangement as disclosed. With this type of valve, there will be a definite movement of the annular magnet 40, even if the flow rates are extremely low.

However this movement is quite small. If an actuating magnet of disc shape as shown in FIGS. 5 and 6 were used, the change in the magnetic field on the Hall effect semiconductor 56 would be too small to effect a switching function. Further, Hall effect semiconductors integrated with comparators or "Schmitt Triggers" to provide a digital output have some hysteresis built-in to overcome oscillation; so, even if switching could be accomplished from an "off" function to an "on" function, the movement of the valve and magnet is so small that there would not be sufficient change in the magnetic field to result in switching the semiconductor 56 back to the "off" function. The disc-shaped permanent magnet 90 provides magnetic flux, or a magnetic field, as indicated by flux lines 92 and 94. This magnet cannot produce as high a field gradient as an annular magnet like magnet 40 to switch the Hall sensor 56.

Referring now to FIGS. 2, 3 and 4, in the present invention, the magnet 40 is shaped similar to a common washer and includes a hole or opening 52 which extends from the first surface 41 to the second surface 42. Some of the magnetic field passes through the hole 52, as indicated by flux lines 96, and the remainder of the magnetic field passes around the outside surface 50, as indicated by flux lines 98.

By careful selection of the ratios between the diameters of the outside surface 50 and the hole 52 and between the diameter of outside surface 50 and thickness 100, it is possible to provide on the magnet axis 105 field reversals of high gradient at different distances from a particular magnet surface, such as surface 41. For example, at a distance 102 (FIGS. 3 and 4) the field will have one direction and at a distance 104 a different direction. Further it is desired that a high gradient or rate of change of field strength exist between the two distances 102, 104 (FIGS. 3,4).

That is, if the surface 41 is a north pole and surface 42 a south pole, adding the hole 52 results in a magnet in which the polarity changes on axis 105 at distance 106.

It is inherent that if sharp reversal in field direction or polarity near one face of a magnet can be acheived, then the rate of change or gradient of the magnetic flux near this one face of the magnet will be high. This gradient is illustrated by an angle 108 of a slope 110 in the gradient curve 103 of FIG. 4 wherein the axis of magnet 40 is indicated by numeral 105, the axial center of hole 52 by numeral 107, and north and south polarities as shown. The polarity or field direction changes at the intersection of distance line 106 with axis 105.

In a preferred embodiment, the actuating magnet 40 has an outside diameter of 12.7 millimeters (0.500 inches), an inside diameter of 4.76 millimeters (0.1875 inches), a thickness of 2.38 millimeters (0.094 inches), and produces about three hundred to four hundred (300–400) gauss.

While the use of the magnet 40 with the Hall effect semiconductor 56 provides a switching device that is effective to provide a switching function with a relatively small mechanical movement, the present invention includes another advance in the art.

In summary, the apparatus is accurately effective to provide an output signal from the Hall sensor 56 representative of and in response to miniscule movement of valve 30, 32 due to a corresponding miniscule rate of fluid flow through ports 48. In other words, by using an annular magnet 40 designed as already explained in contrast with a disc magnet 90, minimum mechanical movement can produce a definite "on" - "off" switching action. The embodiment of the invention disclosed thereby can be used to indicates presence and absence of minimal fluid flow. The same concept may be used for other purposes in which minimum mechanical movement needs to be translated definitively in a change of state of sensor 56.

Another purpose is exemplified by the embodiment shown in FIG. 7 in the form of a typewriter or computer key. Such a key formed of plastic is indicated by the numeral 120 having a center post 122 which carries on the lower end an annular magnet 40 like that previously disclosed. The key 120 is operatively mounted on a supporting frame or substrate in the form of a typical printed circuit board 124, this board having an array of keys 120 mounted thereon according to the arrangement of a typical keyboard.

Secured to the printed circuit board 124 is a tubular guide 126 which slidably receives the magnet 40. Secured to the underside of the magnet 40 is a plastic bearing portion 128 of disc shape and also of a size to be slidably received by the tubular guide 126. The combination of the magnet 40 and bearing portion 128 serve to maintain the key 120 against tilting during reciprocating thereof with respect to the guide 126.

The guide 126 has secured thereto an annular element 130 of soft magnetic material, such as steel. An annular shim portion of non-magnetic material 132 is secured to the upper surface of the magnet 40 so as to be movable therewith and to serve as a spacer between the steel element 130 and the magnet 40. If desired, this annular portion 132 may be omitted as will become evident from the description that follows.

Disposed immediately beneath key 120, and all of the the other keys (not shown) on the circuit board 124 is a Hall effect semiconductor 70 like the previously described semiconductor 56. A plastic retainer 74 much like that previously identified by the numeral 64 is provided with a cylindrical socket 134 which receives a cylindrical calibrating magnet 78 like the magnet 60 previously described. This magnet 78 is a permanent magnet polarized diametrically as shown. A screw driver slot 136 may be provided in one end as a convenient means for rotationally adjusting the magnet 78 with respect to the semiconductor 70. The retainer 74 is suitably secured to the circuit board 124 thereby to maintain the relationship between the calibrating magnet 78 and the semiconductor 70 fixed. Also as previously explained, the calibrating magnet 78 is rotationally adjusted until the semiconductor 70 is biased suitably to a condition as will render it sensitive to the slightest movement of the magnet 40.

As FIG. 7 indictes, the semiconductor 70 is mounted on the axis of the annular magnet 40. Distances and dimensions are the same as previously described such that upon minimal downward movement of the key 120 produces a field change on the semiconductor 70 causing it to change state between "on" and "off". This change of state in the form of an electrical signal can thereby be used in a conventional manner to provide an indication of the change of position of the key 120.

The magnetic attraction between the magnet 40 and the steel element 130 secured to guide 126 holds the key 120 in the "up" position. This holding force is of finite value and must be overcome by the operator in order to move the key downwardly toward sensor 70. Using the finger to depress the key 120 in a conventional manner results in overcoming this holding force. At the moment of initial movement, the force of attraction diminishes rapidly which can be felt by the operator. Thus the operator can sense that the key has been depressed. The pieces and parts of the total assembly are so proportioned and related that upon such initial movement, the sensor 70 is triggered to a change in state. The sensor thus becomes an indicator that the key has been depressed and through tactile feedback, the operator knows that this has occurred.

While specific apparatus have been shown and described, many variations of the present invention will become apparent from reading the preceding specification; therefore, the scope of the present invention is to be determined from the claims that are appended hereto.

INDUSTRIAL APPLICABILITY

The fluid flow indicator of the present invention is applicable for use in any industrial process in which indication of fluid flow is required, and more particularly to uses in which indication of flow of very small fluid flow rates is required. It is particularly applicable to automated processes wherein control of the process dictates that electrical outputs representing each part of the process by available continuously.

The key device of FIG. 7 is applicable for use in any evnironment in which tactile feedback is appropriate for determining key actuation.

More broadly, the two embodiments of FIGS. 1 and 7 contain magnetic microswitches which translate minimal mechanical movement into a change of electrical characteristic of a suitable sensor, whether it be a Hall effect seminconductor, a magneto resistor or a magneto transistor. Such a switching device is particularly applicable to industrial processes in which small size variations in products might be a cause for rejection and in which high speed automated processes require extreme reliability.

While there are a variety of Hall effect sensors or semiconductors (56, 70) available for use in this invention, typical components which are suitable may be one of the following:

Sprague, Inc. - USN-3020

Texas Instruments - TL-170

While there have been described above the principles of this invention in connection with specific apparatus, it is to be clearly understood that this description is made only by way of example and not as a limitation to the scope of the invention.

What is claimed is:

1. A switching device which comprises an actuating magnet having a first surface that is the north pole and a second surface opposed to said first surface that is the south pole, an opening extending between said first and second surfaces to provide a magnetic field having a first polarity at a first distance from one of said surfaces and a second polarity at a second distance from said one of said surfaces;

a sensor which changes state when subjected to fields of said first and second polarities;

means for disposing said sensor proximate to said one surface; and means for selectively changing the relative position of said sensor between said first and said second distances.

2. A switching device as claimed in claim 1 in which said device includes a calibration magnet;

said sensor being disposed in the field of said calibration magnet; and means for selectively changing the field relationshp between said calibration magnet and said sensor.

3. A switching device as claimed in claim 1 in which said means for selectively changing the relative position of said sensor comprises means for moving said actuating magnet.

4. A switching device as claimed in claim 1 in which said actuating magnet comprises a permanent magnet.

5. A switching device as claimed in claim 1 in which said means for selectively changing the relative position of said sensor comprises means for moving said actuating magnet;

a calibration magnet;

said sensor being disposed intermediate said one surface and said calibration magnet;

means for selectively changing the field amplitude and polarity applied by said calibration magnet to said sensor.

* * * * *